(12) United States Patent
Moyer et al.

(10) Patent No.: US 7,627,795 B2
(45) Date of Patent: Dec. 1, 2009

(54) PIPELINED DATA PROCESSOR WITH DETERMINISTIC SIGNATURE GENERATION

(75) Inventors: William C. Moyer, Dripping Springs, TX (US); Jimmy Gumulja, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 492 days.

(21) Appl. No.: 11/460,086

(22) Filed: Jul. 26, 2006

(65) Prior Publication Data

US 2008/0052572 A1    Feb. 28, 2008

(51) Int. Cl.
  G01R 31/28 (2006.01)
  G01R 31/26 (2006.01)
  G11C 29/00 (2006.01)

(52) U.S. Cl. .................... 714/724; 365/201; 324/765; 714/731

(58) Field of Classification Search ........................ None
See application file for complete search history.

(56) References Cited

U.S. PATENT DOCUMENTS

| | | | |
|---|---|---|---|
| 3,671,940 A | 6/1972 | Kronies et al. | |
| 3,839,705 A | 10/1974 | Davis et al. | |
| 4,042,914 A | 8/1977 | Curley et al. | |
| 4,513,418 A * | 4/1985 | Bardell et al. | 714/726 |
| 4,679,194 A | 7/1987 | Peters et al. | |
| 5,485,467 A | 1/1996 | Golnabi | |
| 5,617,021 A | 4/1997 | Goetting et al. | |
| 5,672,966 A | 9/1997 | Palczewski et al. | |
| 5,699,506 A * | 12/1997 | Phillips et al. | 714/37 |
| 5,841,867 A | 11/1998 | Jacobson et al. | |
| 5,900,757 A | 5/1999 | Aggarwal et al. | |
| 6,128,755 A * | 10/2000 | Bello et al. | 714/715 |
| 6,311,311 B1 * | 10/2001 | Swaney et al. | 716/4 |
| 6,393,594 B1 | 5/2002 | Anderson et al. | |
| 6,438,722 B1 | 8/2002 | Bailey et al. | |
| 2002/0129300 A1 | 9/2002 | Floyd et al. | |
| 2002/0178403 A1 | 11/2002 | Floyd et al. | |
| 2004/0216061 A1 * | 10/2004 | Floyd et al. | 716/4 |
| 2006/0282732 A1 * | 12/2006 | Kiryu | 714/738 |
| 2007/0089095 A1 * | 4/2007 | Thekkath et al. | 717/128 |
| 2007/0168736 A1 | 7/2007 | Ottavi et al. | |

OTHER PUBLICATIONS

Crouch, Alfred L.; "Scan Testing"(3.1.3) and "Logic Built-in Self-Test" (3.27.3)"Design for Test for Digital IC's and Embedded Core Systems"; 1999; Title page, Publication Data page, 2 pg Contents, pp. 96-168; Prentice Hall; New Jersey, USA.

Lyon, Jose A. et al; "Testability Features of the 68HC16Z1"; International Test Conference 1991; Oct. 26-30, 1991; pp. 122-129 + 2 cover sheets and index; IEEE.

U.S. Appl. No. 11/355,681, filed Feb. 16, 2006.

* cited by examiner

Primary Examiner—Kevin L Ellis
Assistant Examiner—Guerrier Merant
(74) Attorney, Agent, or Firm—Robert L. King; Joanne G. Chiu (57) ABSTRACT

A pipelined data processing system includes functional circuitry having a plurality of test points located at predetermined circuit nodes within the functional circuitry, at least one staging storage element associated with a pipeline stage of the data processing system which is coupled to receive test data directly from the plurality of test points, and a multiple input shift register (MISR) coupled to receive test data from the at least one staging storage element and provide a MISR result. In one aspect, the at least on staging storage element has a plurality of staging storage elements wherein each of the plurality of staging storage elements corresponds to a different pipeline stage of the data processing system. In another aspect the MISR result is independent of varying memory access times.

23 Claims, 6 Drawing Sheets

PIPELINED DATA PROCESSOR WITH DETERMINISTIC SIGNATURE GENERATION

RELATED APPLICATIONS

The present invention is related to the co-pending applications entitled:

(1) "Method and Apparatus For Testing A Data Processing System" filed on Feb. 16, 2006 having a U.S. Ser. No. 11/355,681 and U.S Pat. No. 7,444,568, and assigned to the same assignee as the present application; and (2) "Data Processor With Reconfigurable Registers" filed of even date herewith, U.S. Ser. No. 11/460,090 and assigned to the same assignee as the present invention.

FIELD OF THE INVENTION

The present invention relates generally to data processors, and more particularly to testing a data processor.

BACKGROUND OF THE INVENTION

Testing of data processing systems is important to ensure proper operation. Testing may be performed in a factory following manufacture and prior to using the data processing system in a user application. The factory testing ensures an end user receives a properly functioning product. However, during operation of the data processing system by an end user, it may also be desirable to test the data processing system so that any failures which occur during normal operation of the product can be detected.

A well known technique to permit integrated circuits to be tested during operation is the use of logic testing registers, called Multiple Input Shift Register (MISR). Multiple input shift registers implement any of a variety of polynomials by receiving data from various internal nodes of the integrated circuit and performing signature compression and accumulation. The signature compression and accumulation is a series of logic operations which result in a single output value known as a signature value. The signature value is compared with a desired value to determine whether the integrated circuit being tested is functioning correctly.

Since the testing of the integrated circuit is being performed on-line or while the integrated circuit is functioning in a real-world application, it is highly desirable to have minimal impact or intrusiveness on system characteristics. A critical component of real-time systems is the interrupt latency or the amount of time required to respond to an interrupt request. Since on-line testing must not adversely affect the responsiveness of a data processing system, known systems typically completely disable the interrupt exception handling of a data processor when testing with a MISR is performed. As a result, known data processing systems also typically strictly limit the length of MISR test sequences.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
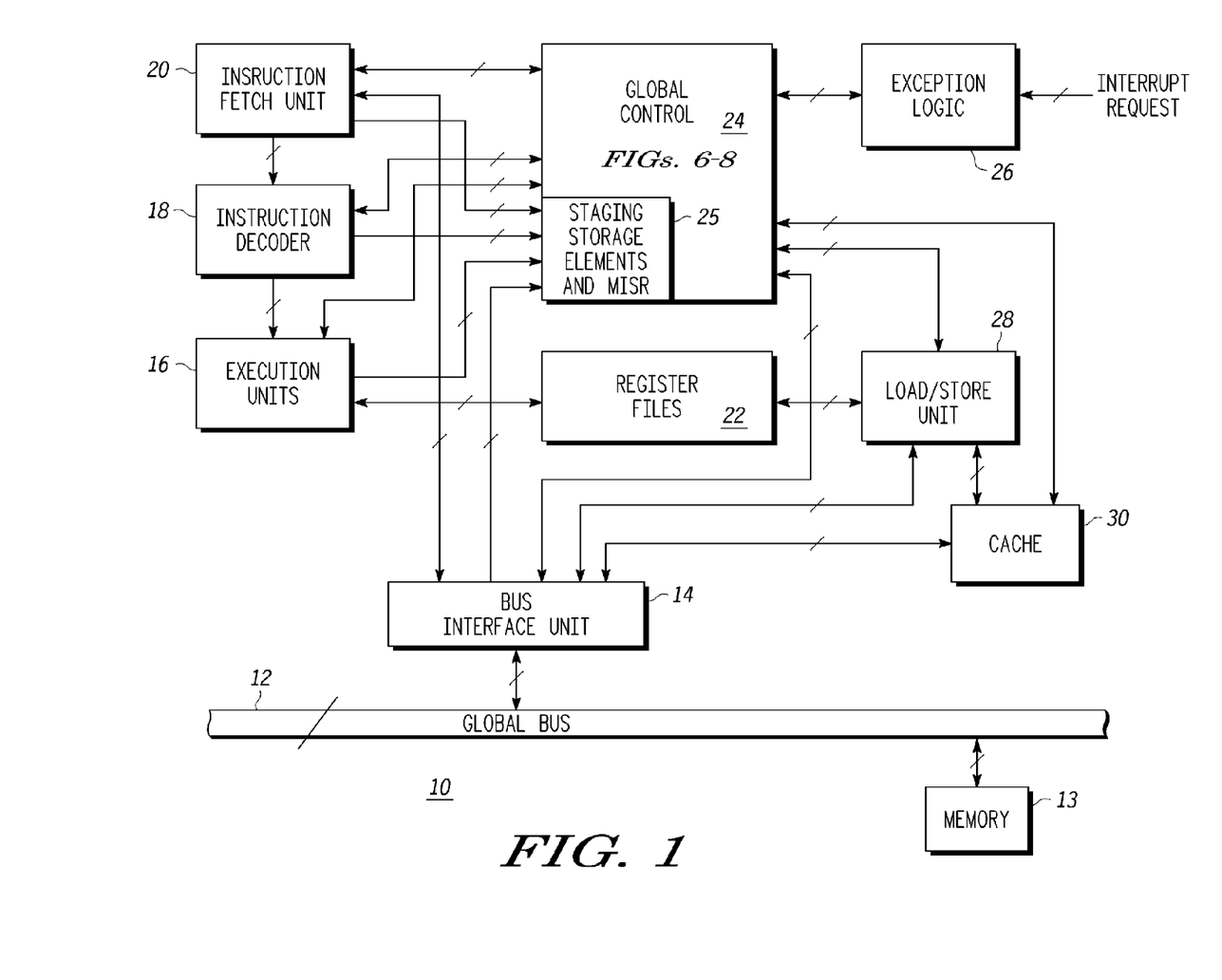
FIG. 1 illustrates a block diagram of a data processing system in accordance with one embodiment of the present invention.

FIG. 1 illustrates a data processing system 10 having efficient deterministic signature generation when placed in a test mode of operation. A multiple-bit global bus 12 functions to communicate data within the data processing system 10. A system memory 13 is connected to the global bus 12 for storage of information in data processing system 10. A bus interface unit (BIU) 14 has a first input/output connected to the global bus 12. The data processing system 10 also includes one or more execution units 16, an instruction decoder 18, an instruction fetch unit 20, register files 22, global control 24, exception logic 26, a load/store unit 28 and a cache 30. A second input/output of the bus interface unit 14 is connected to a first input/output of the instruction fetch unit 20. An output of the bus interface unit 14 is connected to a first input of staging storage elements and MISR 25 which is part of the global control 24. Additional structural details of global control 24 and the staging storage elements and MISR 25 are provided below in connection with FIGS. 6, 7 and 9. A third input/output of the bus interface unit 14 is connected to a first input/output of the load/store unit 28. A fourth input/output of the bus interface unit 14 is connected to a first input/output of cache 30. A second input/output of the instruction fetch unit 20 is connected to a first input/output of the global control 24. A first output of the instruction fetch unit 20 is connected to a second input of staging storage elements and MISR 25. A second output of the instruction fetch unit 20 is connected to an input of an instruction decoder 18. An input/output of instruction decoder 18 is connected to a second input/output of global control 24. A first output of instruction decoder 18 is connected to a third input of staging storage elements and MISR 25. An output of the one or more execution units 16 is connected to a fourth input of staging storage elements and MISR 25. A second output of instruction decoder 18 is connected to a first input of the execution units 16. A third input/output of the global control 24 is connected to a first input/output of execution units 16. A second input/output of execution units 16 is connected to a first input/output of registers files 22. A fourth input/output of the global control 24 is connected to an input/output of exception logic 26. Exception logic 26 also has an input for receiving an Interrupt Request signal. A fifth input/output of the global control 24 is connected to a second input/output of the cache 30. A sixth input/output of the global control 24 is connected to a second input/output of the load/store unit 28. A third input/output of the load/store unit 28 is connected to a second input/output of the register files 22. A fourth input/output of the load/store unit 28 is connected to a third input/output of the cache 30. A seventh input/output of global control 24 is connected to fifth input/output of the bus interface unit 14. It should be understood that other forms of data processing system 10 may not utilize cache 30 but rather use memory that is located outside of the data processing system 10. It should also be understood that the location of control circuitry within the data processing system 10 is implementation specific. For example, various control circuitry will be located within each of the functional units of the instruction fetch unit 20, the instruction decoder 18, the execution units 16 and the register files 22 for more limited control than the global control 24. Illustrated conductors and buses that are multiple bit conductors are represented with a slash through the conductor or bus.

In operation, data processing system 10 is implemented as a pipelined data processing system. That means that the execution of data processing instructions functions in discrete time intervals in which a particular function in the execution occurs during each time interval. For example, reference to a pipeline 32 in FIG. 2 will illustrate one form of data processing pipelining. In one form, instruction execution advances in a pipeline in response to a system clock wherein each cycle of the system clock advances the execution by one stage.

Figure 2:
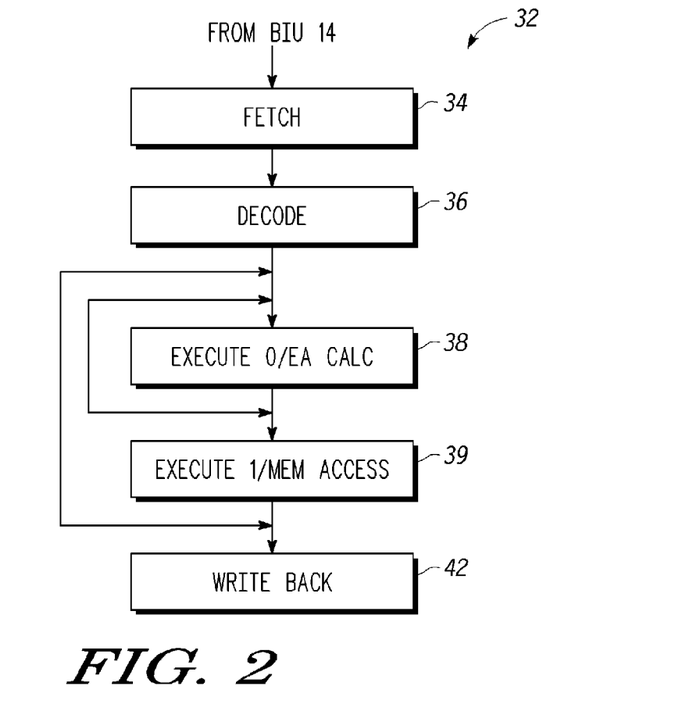
FIG. 2 illustrates in flow chart form the functionality of a pipelined operation in the data processing system of FIG. 1.

In a first operation an instruction is fetched in a pipeline stage 34 from the bus interface unit 14 by the instruction fetch unit 20. In a pipeline stage 36, the fetched instruction is coupled to the instruction decoder 18 from the instruction fetch unit 20 and decoded. The resulting decoded instruction is then coupled to execution units 16 and instruction execution begins in a pipeline stage 38. In some forms the instruction execution occurs during two cycles of the system clock. In the illustrated form in the pipeline stage 38 a first phase of instruction execution labeled "execute 0" occurs. Alternatively for a memory operation an effective address (EA) calculation occurs. Depending upon the instruction functionality, the result of pipeline stage 38 is fed back and used as a subsequent input. In a pipeline stage 39 instruction execution is completed with a second phase labeled "execute 1". Alternatively for a memory operation a memory access is performed. Depending upon the instruction functionality, the result of pipeline stage 39 is fed back and used as a subsequent input. In a pipeline stage 42 a result write back, such as to register files 22, is performed. The various pipeline stages which are described herein are defined herein as "staging". In other words, staging is the operation of data processing system in specific stages each having a predetermined function or functions. Staging is also the association of specific hardware circuitry with the functions of each stage in the ordered sequence which forms the data processing pipeline.

The discussion of the operation of data processing system 10 to this point is conventional. Additionally, data processing system 10 has a real-time test capability that permits testing of various test points located at predetermined circuit nodes within the functional circuitry of data processing system. For example, the various test points may be located within any or all of the functional blocks illustrated in FIG. 1. The real-time testing of data processing system 10 is accomplished with staging storage elements and MISR 25 that is within the global control 24. Each of the staging storage elements is a storage element such as a register, flip-flop or other data retention structure. One or more of the stages of the pipeline of the data processing system may utilize at least one staging storage element. Each of these staging storage elements is coupled via the buses illustrated in FIG. 1 to receive test data directly from the plurality of test points. In this manner each of the staging storage elements receives and stores test data occurring at a particular pipeline stage. A MISR within the staging storage elements and MISR 25 is coupled to receive test data from the staging storage elements and provides a MISR result that is typically referred to as a MISR signature. A MISR signature is generated by accumulating the values of specific test points and test data from the staging storage elements during execution of a predetermined number of processor instructions. The value of the MISR signature and the structure of the MISR itself is polynomial specific and test point specific and will thus vary from implementation to implementation. The MISR result can be compared with an expected MISR value for the implemented polynomial and a determination made whether the data processing system is working correctly.

Multiple MISR registers may be implemented to allow for a larger number of test points to be captured for signature generation. Additionally, it is desirable to be able to accumulate the values of test points associated with various stages of the processing pipeline in order to allow testing of logic elements within the various stages. One difficulty that arises however, is that various instructions are present in the different pipeline stages at each point in time the MISR registers are updated. A change in the relationship between the contents of the various pipeline stages can result in incorrect final accumulated signature values from the MISR registers, which would be interpreted as a failure. This change in relationship can occur due to the injection of interrupts, or due to stalling of one or more stages of the pipeline such as from varying memory access times. To avoid this, prior art systems have required that interrupts be disabled during the accumulation of a MISR signature, and further have required that no indeterminate processor stall cycles occur during MISR signature accumulation. These restraints place a severe limitation on interrupt responsiveness since interrupts must be blocked from occurring during execution of a sequence of instructions which are used to generate a MISR signature value. Also, any indeterminacy in the number of cycles an instruction spends in each stage of the processor pipeline must be likewise avoided in order to accumulate a deterministic MISR signature. Cycle indeterminacy is especially problematic if a cache memory is used to hold the instruction stream or data operands, since a cache miss event can cause a stall of one or more pipeline stages, and cause an incorrect accumulation of the same test point values during multiple clocks while one or more portions of the pipeline are stalled. In some embodiments, load and store accesses to memory outside of data processing system 10 may not have deterministic timing due to common events like bus arbitration uncertainties, higher level caches, refresh events to dynamic memory, etc. In some pipeline embodiments, stages of the pipeline may be loosely coupled, such that a stall in a later pipeline stage does not directly cause an immediate stall in an earlier stage. For example, a load instruction stalled in the execute 1 pipeline stage 39 of the illustrated pipeline 32 may not cause a subsequent instruction which was delayed in the fetch pipeline stage 34 due to an extended memory access from flowing through the decode pipeline stage 36 and execute 0 pipeline stage 38 while the execute 1 pipeline stage 39 is stalled. Such changes in relationships are not readily handled by conventional systems which do not incorporate the test point staging capability provided by the staging storage elements and MISR 25.

Further explanation below is required to appreciate how the staging storage elements and MISR 25 provide the ability to test data processing system 10 without negatively impacting the interrupt latency of the system.

Registers files 22 are general purpose register files and are shared between the load/store unit 28 and the execution units 16. The load/store unit 28 operates in response to the global control 24 and provides data to and receives data from the bus interface unit 14. The load/store unit 28 also provides data to and receives data from the general purpose registers within the register files 22. Exception logic 26 functions to generate any of various types of data processing exceptions. An interrupt request may be generated and provided to the interrupt logic 26 in response to various events either within the illustrated data processing system 10 or from sources external to the data processing system 10. For example, instruction execution latency resulting from the generation of wait states may cause the generation of an exception as may the occurrence of faults resulting from instruction execution errors. Various types of real-time interrupt requests may also be received by exception logic 26 via one or more interrupt request inputs.

Figure 3:
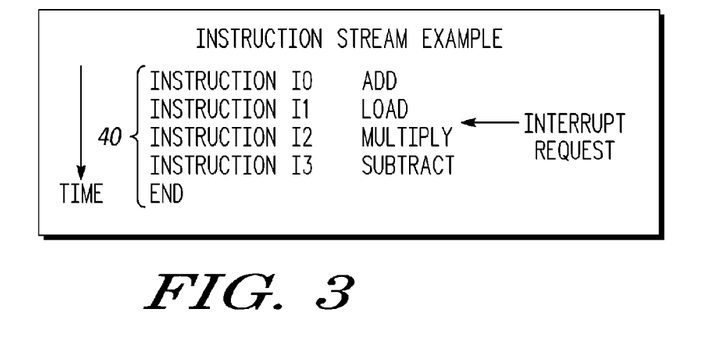
FIG. 3 illustrates in table form an exemplary instruction stream that is executed within the data processing system of FIG. 1.

As an example of a pipelined instruction execution, refer to FIG. 3 which illustrates an exemplary instruction stream. A group of instructions 40 which are executed sequentially in time is provided. For example, a first instruction labeled I0 is an Add instruction and instructs data processing system 10 to add two operands. A second instruction I1 is executed which directs the data processing system 10 to load an operand in a specified location. A third instruction I2 is a multiply instruction specifying the multiplication of two operands and a fourth instruction I3 is a subtract instruction. However, assume that as execution of instruction I1 is occurring (i.e. before execution of the third instruction I2 begins) an interrupt request is received by the exception logic 26. In this case, execution of the group of instructions 40 is interrupted at a boundary between instruction I1 and instruction I2.

Figure 4:
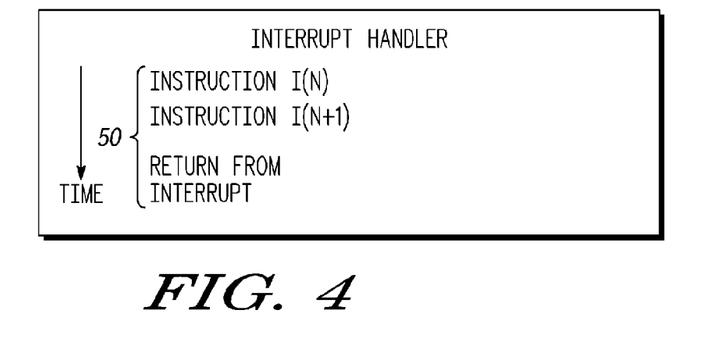
FIG. 4 illustrates in table form an exemplary instruction flow for an interrupt handler performed by the data processing system of FIG. 1.

Illustrated in FIG. 4 is an exemplary interrupt instruction flow which occurs when handling an interrupt. A group of instructions 50 is illustrated for sequential execution in time by an interrupt handler. A first instruction of instructions 50 is an instruction I(N) and a second instruction of instructions 50 is an instruction I(N+1). After execution of instruction I(N+1) a return from interrupt (RTI) instruction is executed which redirects instruction flow back to instruction I2 of FIG. 3.

Figure 5:
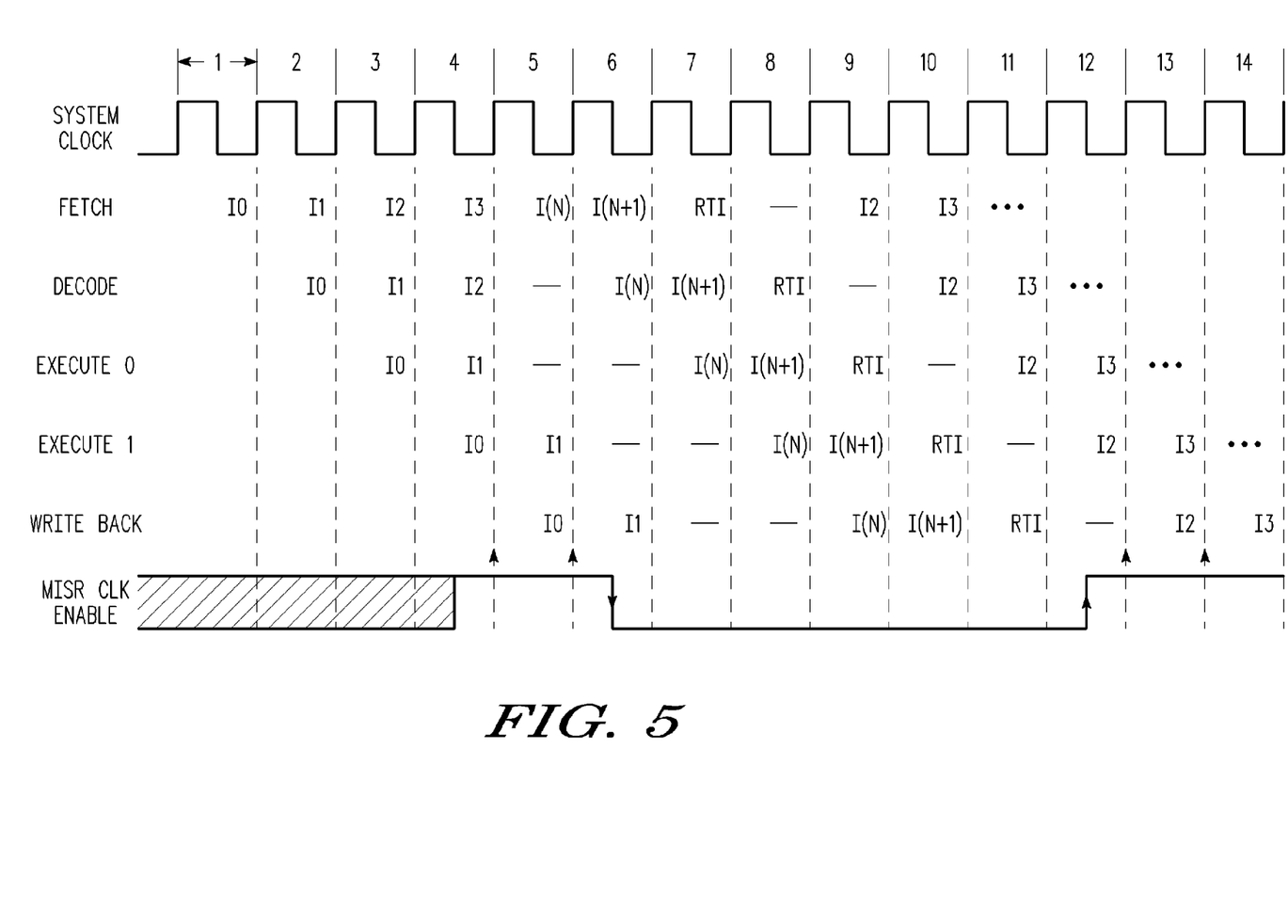
FIG. 5 illustrates in timing chart form an exemplary operation of the data processing system of FIG. 1 during exception processing.

Referring to FIG. 5 the instruction stream example of FIGS. 3 and 4 is further illustrated with a timing chart. Pipeline stages are identified as fetch, decode, execute 0, execute 1 (i.e. two stages of execution) and write back as was explained above in connection with FIG. 2. A system clock is provided by the global control 24 and controls the length of each phase of a stage. The system clock is a synchronous clock of a predetermined frequency. For purposes of explanation, the synchronous clock has sequentially numbered cycles or phases. In the illustrated example the first instruction I0 has been fetched, decoded and is in the second stage of execution when the interrupt request that is illustrated in FIG. 3 is acknowledged. The instruction I1 is in the first stage of execution when the interrupt request is acknowledged, but instruction I2 has not begun execution. Assume that the priority of the interrupt request is such that no interrupt latency due to continued instruction stream execution is desired. The interrupt request signal is received during cycle four of FIG. 5 and therefore prior to the start of execution of instruction I2.

Upon detection by circuitry of global control 24 of a non-interrupt instruction being in the second execution stage of the pipeline, a MISR clock (Clk) enable signal is active. In the illustrated form assume that a logic high signal is the active state. The logic state of the MISR clock enable signal prior to cycle four is indeterminate as indicated by the hashed lines in FIG. 5 and depends upon the non-illustrated instruction flow that was immediately prior to instruction I0. At the rising clock edge that begins cycle five, the MISR of staging storage elements and MISR 25 captures the data value for instruction I0 that is being written to storage during a write back stage of the pipeline. Assuming that the interrupt request signal is acknowledged during cycle four, the first interrupt signal I(N) is fetched during cycle five. Because the circuitry of global control 24 detects during cycle five that a non-interrupt instruction, instruction I1, is completing execution in the second execute stage of the pipeline, the MISR clock enable signal remains active during cycle six. Also during cycle five the instruction decoder 18 is flushed so that its contents are nulled out to a predetermined value. Additionally the first stage of execution units 16 is flushed as indicated by the "dash" marks of FIG. 5 during cycle five. Upon the rising clock edge that begins cycle six (denoted by an arrowhead), the executed data value for instruction I1 is captured by the MISR of the stage elements and MISR 25. During cycle six the circuitry of global control 24 detects that no instruction is completing execution in the second execute stage (execute 1) of the pipeline and therefore the MISR clock enable signal is made inactive. The inactivation of the MISR clock enable signal will ensure that no data is stored by the MISR of staging storage elements and MISR 25 resulting from exception processing. The storing of such data would lead to an erroneous signature value in the MISR, even if only one cycle's worth of interrupt processing was placed in the MISR. Also during cycle six the instruction decoder 18 decodes interrupt instruction I(N) and instruction fetch unit 20 retrieves interrupt instruction I(N+1). During cycle seven the return from interrupt (RTI) instruction is fetched by the instruction fetch unit 20.

Because the return from interrupt instruction is the last instruction to be processed in the set of interrupt instructions 50, the instruction I2 of the group of instructions 40 is fetched again by instruction fetch unit 20 during cycle nine. During cycle seven the exception instruction I(N) is executed in the first stage of the execution units 16, and the exception instruction I(N+1) is decoded. During cycle eight the exception instruction I(N) is executed in the second stage of the execution units 16. Also during cycle eight the return from interrupt instruction is decoded, indicating completion of the interrupt handler of FIG. 4.

During cycle nine the instruction I2 of the group of instructions 40 is fetched by instruction fetch unit 20. The instruction decoder 18 decodes instruction I2 while the execution units 16 are executing exception instructions RTI and I(N+1). During cycle ten the instruction I2 is decoded, and instruction I3 is fetched. Instruction I2 begins the first stage of execution in cycle 11. Additionally, interrupt instruction RTI is written back to register files 22. It should be noted however that the executed result of interrupt instructions I(N), I(N+1) and RTI is not written to the MISR of the staging storage elements and MISR 25 because the MISR clock enable signal is not active during cycles nine, ten and eleven when these interrupt handler instructions are completing execution for a write back operation. One or more instruction(s) (not shown) are fetched beginning with cycle eleven.

During cycle eleven, the final interrupt instruction I(N+1) is written back to register files 22 or other storage. In cycle ten the pipeline is also further advanced with normal instructions I2 and I3. Circuitry within global control 24 detects that a non-interrupt instruction is completing execution in the second execution stage of the pipeline during cycle twelve. As a result, the MISR clock enable signal is made active at some point during cycle twelve after the initial rising clock edge that begins cycle twelve. At the beginning of cycle thirteen the data value associated with instruction I2 is written into the MISR of the staging storage elements and MISR 25. This data value is captured at the rising clock edge beginning cycle thirteen as noted by an arrowhead in FIG. 5. Additionally, instruction I3 completes execution in the second execution stage of the pipeline. Additional instructions (not shown) are fetched, decoded and begun execution during clock cycle thirteen. During clock cycle fourteen, the data value created by executing instruction I3 is stored in the MISR of the staging storage elements and MISR 25 at the rising edge of the system clock. The rising edge capture of the data value for instruction I3 is also illustrated in FIG. 5 with an arrowhead.

Thus it should be appreciated from the timing diagram of FIG. 5 that a pipelined execution of instructions is provided with a MISR function wherein only normal instruction execution results are captured by the MISR. Results from exception processing do not influence the MISR and thus do not alter the signature value created by the MISR. The instruction flow illustrated in FIG. 5 has reduced interrupt latency because interrupt processing is not disabled during the MISR operation. Instead, exception processing is permitted to occur but is prevented from altering the MISR signature value and creating an incorrect MISR result.

Figure 6:
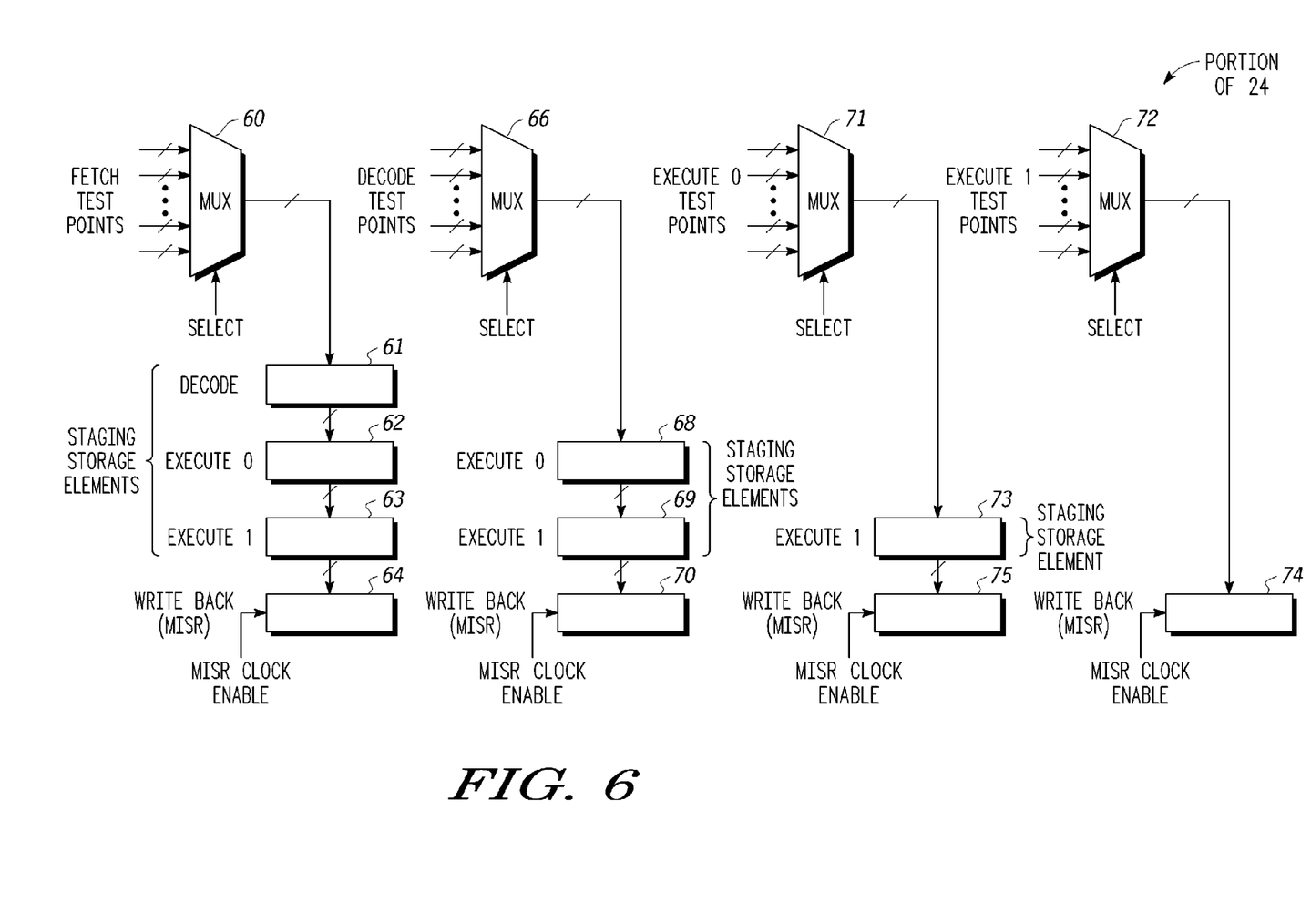
FIG. 6 illustrates in block diagram form an exemplary form of a portion of the global control circuitry of the data processing system of FIG. 1.

Illustrated in FIG. 6 is a portion of the global control 24. The MISR function is to test a large plurality or variety of points within the data processing system 10. For example, a plurality of fetch test points are identified within the instruction fetch unit 20. These fetch test points are electrically connected to respective inputs of a multiplexor (Mux) 60. A Select signal is connected to a control input of multiplexor 60. A plurality of decode test points is identified within the instruction decoder 18. These decode test points are electrically connected to respective inputs of a multiplexor (Mux) 66. The Select signal is connected to a control input of multiplexor 66. A plurality of execute test points within the execution units 16 are identified. These execute test points are electrically connected to respective inputs of a multiplexor (Mux) 72. The Select signal is connected to a control input of multiplexor 72. Any number of test points may be implemented. Typically a number of test points that is a multiple of two is selected. While FIG. 1 illustrated test point information be connected from the instruction fetch unit 20, the instruction decoder 18, the execution units 16 and the bus interface unit 14, it should be understood that test points may also be implemented in other portions of data processing system 10 including the exception logic 26, the load/store unit 28, register files 22 and cache 30. An output of multiplexor 60 is sequentially clocked through a plurality of staging storage elements. Each staging storing element is correlated to a specific stage of the pipeline of the data processing system 10 subsequent to the instruction fetch stage. For example, storage element 61 corresponds to the decode stage of the pipeline. Storage element 62 corresponds to the first execute stage, execute 0, of the pipeline. Storage element 63 corresponds to the second execute stage, execute 1, of the pipeline. The output of multiplexor 60 is connected to an input of storage element 61. An output of storage element 61 is connected to an input of storage element 62. An output of storage element 62 is connected to an input of storage element 63. An output of storage element 63 is connected to an input of a MISR 64. The MISR 64 corresponds to the Write Back stage of the pipeline. MISR 64 has a control input for receiving the MISR clock enable signal.

Similarly, a multiplexor 66 is provided having a plurality of inputs that are respectively connected to one of a plurality of test points within the instruction decoder 18. An output of multiplexor 66 is sequentially clocked through a plurality of staging storage elements. Each staging storing element is correlated to a specific stage of the pipeline of the data processing system 10 subsequent to the decode stage. For example, storage element 68 corresponds to the first execute stage, execute 0, of the pipeline. Storage element 69 corresponds to the second execute stage, execute 1, of the pipeline. The output of multiplexor 66 is connected to an input of storage element 68. An output of storage element 68 is connected to an input of storage element 69. An output of storage element 69 is connected to an input of a MISR 70. The MISR 70 corresponds to the Write Back stage of the pipeline. MISR 70 has a control input for receiving the MISR clock enable signal.

A multiplexor 71 is provided having a plurality of inputs that are respectively connected to one of a plurality of test points within the Execute 0 stage of execution units 16. An output of multiplexor 71 is sequentially clocked through a staging storage element 73 that is correlated to the second execute stage, execute 1, of the pipeline. The output of multiplexor 71 is connected to an input of storage element 73. An output of storage element 73 is connected to an input of a MISR 75. The MISR 75 corresponds to the Write Back stage of the pipeline. MISR 75 has a control input for receiving the MISR clock enable signal.

A multiplexor 72 is provided having a plurality of inputs that are respectively connected to one of a plurality of test points within the Execute 1 stage of execution units 16. A control input of multiplexor 72 is connected to the select signal. An output of multiplexor 72 is connected to an input of a MISR 74. The MISR 74 corresponds to the Write Back stage of the pipeline. MISR 74 has a control input for receiving the MISR clock enable signal. In the illustrated form, storage elements 61-63, 68-69 and 73 are the staging storage elements of staging storage elements and MISR 25. The MISRs 64, 70, 74 and 75 are the MISR elements of the staging storage elements and MISR 25. From the combination of the figures discussed to this point it is apparent that a MISR implementation has been provided having reduced exception handling latency because of the staging correlation of storage elements. The staging storage elements permit the use of selective MISR write backs so that exception handling does not have to be disabled completely when testing of a data processing system occurs. Additionally, the staging storage elements allow exception processing to occur real-time without putting additional values in the MISR storage devices which would result in an incorrect value in one or more of the MISRs. Without the use of the staging storage elements and the associated control over clocking of the MISR registers by use of the MISR clock enable, the inputs to the MISRs 64, 70, 74 and 75 would not be correlated to the sequential execution of instruction group 40. Thus the presence of an interrupt occurring during execution of the instruction group 40 would cause accumulation of test point values from instruction group 50 as well as from the subsequent refetching of instructions I2 and I3, and the re-decoding of instruction I2, resulting in an incorrect signature value.

Figure 7:
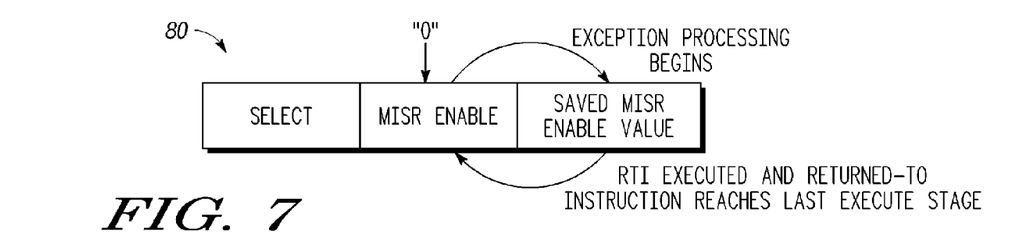
FIG. 7 illustrates in diagram form an exemplary storage device under control of a user command to be used by control circuitry of the data processing system of FIG. 1.

Illustrated in FIG. 7 is a register 80 functioning under control of a user command. The user command or instruction permits a user of data processing system 10 to have software control to switch between a normal mode of operation and a test mode of operation. The command may be implemented as a software instruction and may be part of one or more fields of a data processing instruction rather than a distinct instruction. In some embodiments the three illustrated fields of register 80 may not be contiguous. In the illustrated form a select field, a MISR enable field and a Saved MISR Enable Value field are provided. The select field is used to form the Select signal of FIG. 6 and is encoded to pick which test points of the multiplexors 60, 66, 71 and 72 are selected. The MISR enable field is a control signal that enables the general test functionality described herein. In alternate forms the MISR enable field may be subdivided to enable or disable different MISRs associated with various test points in data processing system 10. In other words, the MISR enable field of register 80 may selectively enable some or all of MISRs 64, 70, 74 and 75.

The MISR enable field of register 80 is not the same signal as the MISR clock enable signal of FIG. 6. The register 80 permits user flexibility in providing diagnostic testing for the data processing system 10. When logic within the global control 24 determines exception processing is occurring at an appropriate point in the pipeline (either from an interrupt, a wait state or other exception), the current value of the MISR enable field in the MISR register is saved off. This value is designated in FIG. 7 as a "saved MISR enable value" because it is the enabling value in the MISR prior to the MISR being disabled in response to exception processing being detected. The enable value in the MISR Enable field of the MISR is then nulled to a predetermined disabling value such as "0". Exception processing and exception handler instruction execution then occurs without the MISR being enabled and no erroneous values are placed into the MISR. Logic circuitry within the global control 24 monitors for the occurrence of an RTI instruction being executed and when the returned-to instruction (i.e. the last normal instruction not executed) reaches the last execution stage in the pipeline. When both of these conditions are met, the saved MISR enable value is transferred back into the MISR enable field of register 80 and MISR enablement occurs if it was previously enabled prior to the exception occurrence. Because exception processing is no longer occurring at this point, storage of the correct information into one or more MISRs will begin.

Figure 8:
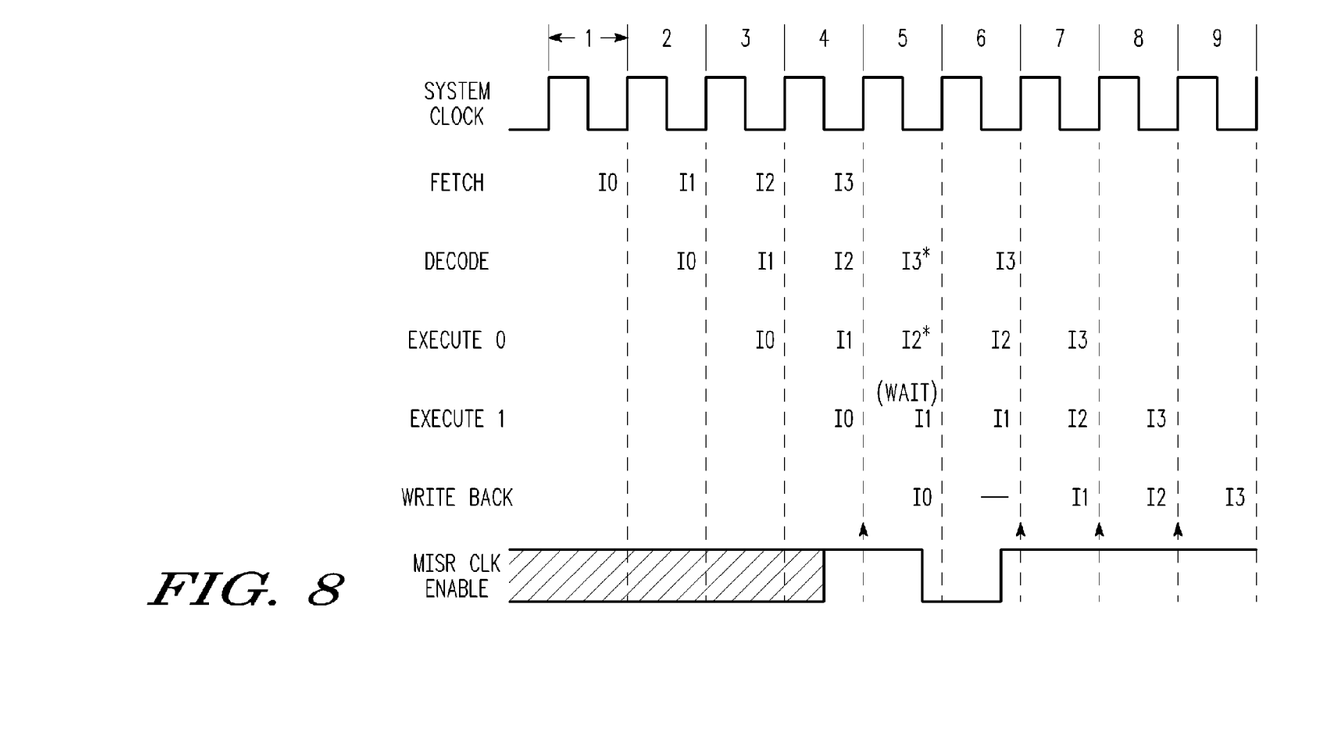
FIG. 8 illustrates in timing chart form an exemplary operation of the data processing system of FIG. 1 during the presence of one or more wait states.

Illustrated in FIG. 8 is an example of another instruction stream execution within data processing system 10 wherein execution of sequential instructions I0, I1, I2, I3, etc. occurs. In this example no interrupt processing occurs. However, due to varying memory access times, the completion of load instruction I1 requires more than one clock cycle. The MISR clock enable signal must be controlled when this situation occurs to avoid the duplicative updating of values into the MISR since the pipeline is not advanced. In FIG. 8 the pipeline stages are again identified as fetch, decode, execute 0, execute 1 (i.e. two stages of execution) and write back as was explained above in connection with FIG. 5. A system clock is provided by the global control 24 and controls the length of each phase of a stage. The system clock is a synchronous clock of a predetermined frequency. For purposes of explanation, the synchronous clock has nine sequentially numbered cycles or phases. In the illustrated example the first instruction I0 has been fetched, decoded and is in the second stage of execution in cycle four when the MISR clock enable is asserted. At the beginning of clock cycle five as indicated by an arrowhead the value associated with instruction I0 is captured in the MISR 64. During clock cycle five logic circuitry within the global control 24 determines that instruction I1 is unable to complete execution in cycle five due to a wait condition resulting from a variable memory access time. As a result, the MISR clock enable signal is disabled. During cycle six the logic within global control 24 detects that execution of instruction I1 will complete. As a result of the instruction I1 completing execution in cycle six, the MISR clock enable signal is again asserted during cycle six. As indicated by an arrowhead at the rising edge of clock cycle seven, the values of the MISRs 64, 70, 74 and 75 are updated. Because instruction processing continues to complete in a single cycle in each stage of the pipeline and no interrupts occur, the MISR clock enable signal remains asserted. Sampled test values for instructions I2 and I3 are sequentially accumulated into the MISRs 64, 70, 74 and 75 during clock cycles eight and nine, respectively. Other non-exception instructions (not shown) may or may not immediately follow instruction I3. Thus it is apparent that by blocking the enabling of MISR capturing of data during a pipeline stall due to variable memory access times, no erroneous values were placed in the MISR to create a MISR error.

Figure 9:
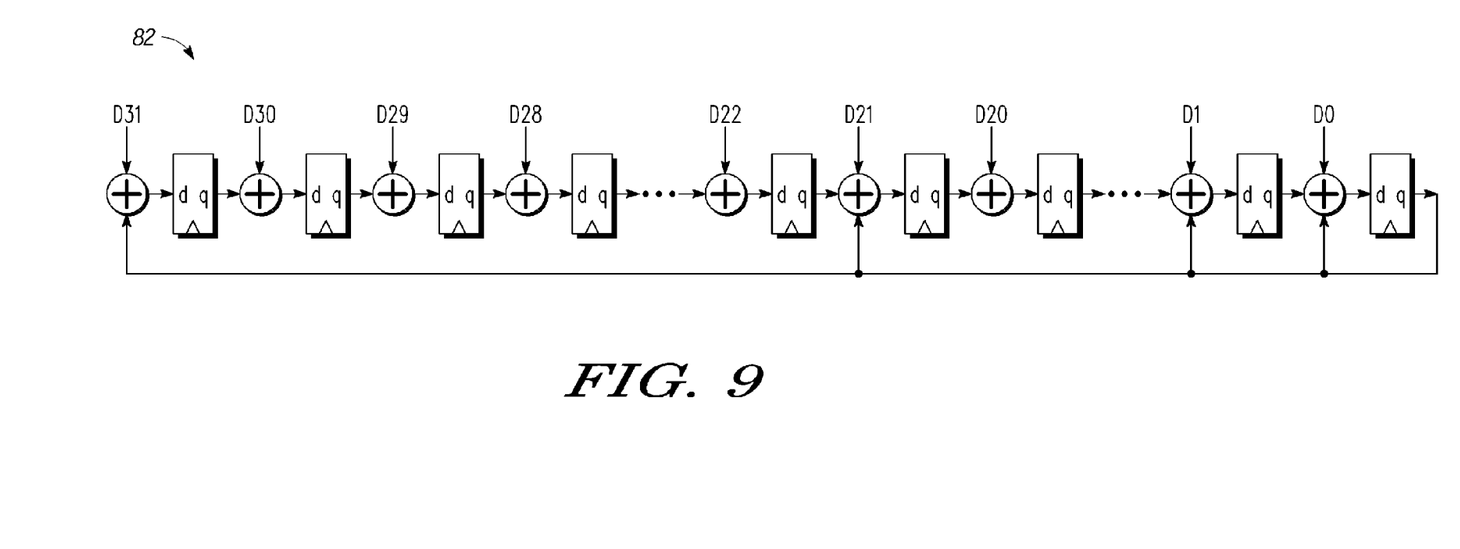
FIG. 9 illustrates in logic diagram form an exemplary multiple input shift register (MISR) for use in the data processing system of FIG. 1.

Illustrated in FIG. 9 is an example of a MISR circuit 82 that may be used for any of the MISRs 64, 70, 74 and 75 of FIG. 6. The MISR circuit 82 is a plurality of serially connected logic exclusive OR gates and conventional D/Q flip-flop storage circuits. Each D terminal represents an input and each Q output represents an output. Each exclusive OR gate has a first input for receiving a data value that represents one of the selected test points. In the illustrated form the MISR circuit 82 is storing thirty-two test points. Each exclusive OR gate also has a second input for receiving an output of an immediately preceding flip-flop. The left-most exclusive OR gate receives an input from a right-most flip-flop. Several exclusive OR gates also have a third input for receiving the output from the right-most flip-flop. Which exclusive OR gates have two inputs and which have three inputs is polynomial-specific. The implementation of MISR circuitry is conventional and will therefore not be discussed in further detail. MISR circuit 82 receives deterministic values from test points in the data processing system and compresses these values into a test value known as a signature as conventional MISRs operate.

By now it should be apparent that there has been provided a method for supporting on-line testing in a data processing system. The on-line testing is user programmable and uses signal staging correlated to the stages of the pipeline to reduce exception processing latency. Exception processing is permitted to occur real-time as opposed to disabling the exception processing function. Errors in the test data are avoided even though exception processing is permitted. By providing data processor pipeline stage staging registers to hold sampled test point signals, the test points can be controllably moved through a series of storage devices which are updated as the processor pipeline advances. The stage values are accumulated into a compressed signature at or near the end of the processor pipeline.

In one form there is provided a pipelined data processing system having functional circuitry having a plurality of test points located at predetermined circuit nodes within the functional circuitry. At least one staging storage element is associated with a pipeline stage of the data processing system, the at least one staging storage element being coupled to receive test data directly from the plurality of test points. A multiple input shift register (MISR) is coupled to receive test data from the at least one staging storage element and provide a MISR result. In another form the at least one staging storage element includes a plurality of staging storage elements wherein each of the plurality of staging storage elements corresponds to a different pipeline stage of the data processing system. In another form the test data is provided from one staging storage element to another staging storage element as a corresponding instruction being executed by the data processing system progresses from one corresponding pipeline stage to another corresponding pipeline stage. In yet another form there is provided control circuitry coupled to enable the MISR when the corresponding instruction being executed by the data processing system progresses to a write back stage of the pipeline.

In another form there is provided a second MISR coupled to receive test data from at least a portion of the at least one staging storage element. In one form there is provided at least one other staging storage element associated with a pipeline stage of the data processing system. The at least one other staging storage element is coupled to receive test data from a second plurality of test points located at predetermined nodes within the functional circuitry. A second MISR is coupled to receive test data from the at least one other staging storage element. In yet another form the at least one staging storage element includes a first number of staging storage elements, each of the first number of staging storage elements corresponding to a different pipeline stage of the data processing system, and the at least one other staging storage element including a second number of staging storage elements. Each of the second number of staging storage element corresponds to a different pipeline stage of the data processing system, and the second number is different than the first number. In another form a second MISR is coupled to receive test data from a second plurality of test points located at predetermined nodes within the functional circuitry. In another form the MISR operates during a test mode and the pipelined data processing system further includes control circuitry coupled to the MISR to selectively enable the MISR during the test mode. In another form the MISR result is independent of varying memory access times. In yet another form the MISR operates during a test mode, and wherein exceptions are continuously enabled during the test mode.

In another form there is provided a method wherein during operation of the data processing system a test mode is entered. Test data is captured and a deterministic signature is generated in a multiple input shift register (MISR) during the test mode, while maintaining exceptions enabled during the test mode such that exceptions can be received and handled during the test mode. In one form the deterministic signature generated during the test mode is used to test functionality of circuitry within the data processing system. In another form maintaining the exceptions enabled includes maintaining interrupts enabled. In another form capturing the test data and generating the deterministic signature in the MISR during the test mode includes providing functional circuitry having a plurality of test points located at predetermined circuit nodes within the functional circuitry. In one form at least one staging storing element associated with a pipeline stage of the data processing system is provided. In this form the at least one staging storage element is coupled to receive test data directly from the plurality of test points. A MISR is provided which receives test data from the at least one staging storage element and provides the deterministic signature. In one form the MISR is selectively enabled during the test mode. In another form there is provided a method in a pipelined data processing system of providing functional circuitry having a plurality of test points located at predetermined circuit nodes within the functional circuitry. At least one staging storage element associated with a pipeline stage of the data processing system is provided, the at least one staging storage element receives test data directly from the plurality of test points. A multiple input shift register (MISR) is provided which receives test data from the at least one staging storage element and provides a MISR result. In one form the MISR result is independent of varying memory access times. In another form the MISR is enabled when a corresponding instruction enters a write back pipeline stage of the pipelined data processing system. In yet another form at least one other staging storage element associated with a pipeline stage of the data processing system is provided, the at least one other staging storage element receives test data from a second plurality of test points located at predetermined nodes within the functional circuitry. A second MISR which receives test data from the at least one other staging storage element is provided. The second MISR is enabled when a corresponding instruction enters a write back pipeline stage of the pipelined data processing system. In yet another form the at least one staging storage element has a first number of staging storage elements and the at least one other staging storage element has a second number of staging storage elements, the first number being different than the second number.

In another form there is provided a method of testing a data processor. Circuitry is provided for placing the data processor in a test mode of operation. Circuitry for enabling a multiple input shift register (MISR) to capture data in the multiple input shift register is provided to create a test value when the data processor is in the test mode of operation. Circuitry is provided for selectively blocking enablement of the multiple input shift register (MISR) during at least a portion of exception processing performed by the data processor when the data processor was placed in the test mode of operation prior to exception processing. In one form circuitry is provided for selectively blocking enablement of the multiple input shift register (MISR) during a pipeline stall of the data processor. In another form it is detected that the pipeline stall is a result of a presence of a wait state in the pipeline resulting from variable memory access time In the foregoing specification, the invention has been described with reference to specific embodiments. However, one of ordinary skill in the art appreciates that various modifications and changes can be made without departing from the scope of the present invention as set forth in the claims below. For example, it should be understood that the circuitry described herein may be implemented either in silicon or other semiconductor materials or alternatively by a software code representation of silicon or other semiconductor materials.

Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A pipelined data processing system, comprising:
    functional circuitry having a plurality of test points located at predetermined circuit nodes within the functional circuitry;
    at least one staging storage element associated with a pipeline stage of a pipeline of the pipelined data processing system, the at least one staging storage element coupled to receive test data directly from the plurality of test points;
    a multiple input shift register (MISR) coupled to receive test data from the at least one staging storage element and provide a MISR result, the MISR having a clock enable input for receiving an enabling clock that enables and disables the MISR, the enabling clock permitting execution results of at least one non-interrupt instruction in an execution stage of the pipeline to be clocked into the MISR while an interrupt signal is being fetched and at least a portion of non-interrupt instruction execution is discarded from the pipeline by being flushed and nulled out to a predetermined value.

2. The pipelined data processing system of claim 1, wherein the at least one staging storage element comprises a plurality of staging storage elements wherein each of the plurality of staging storage elements corresponds to a different pipeline stage of the pipelined data processing system.

3. The pipelined data processing system of claim 2, wherein test data is provided from one staging storage element to another staging storage element as a corresponding instruction being executed by the pipelined data processing system progresses from one corresponding pipeline stage to another corresponding pipeline stage.

4. The pipelined data processing system of claim 3, further comprising:
    control circuitry coupled to enable the MISR when the corresponding instruction being executed by the pipelined data processing system progresses to a write back stage of the pipeline.

5. The pipelined data processing system of claim 1, comprising:
    a second MISR coupled to receive test data from at least a portion of the at least one staging storage element.

6. The pipelined data processing system of claim 1, comprising:
    at least one other staging storage element associated with a pipeline stage of the pipelined data processing system, the at least one other staging storage element coupled to receive test data from a second plurality of test points located at predetermined nodes within the functional circuitry; and
    a second MISR coupled to receive test data from the at least one other staging storage element.

7. The pipelined data processing system of claim 6, wherein the at least one other staging storage element comprises a first number of staging storage elements, each of the first number of staging storage elements corresponding to a different pipeline stage of the pipelined data processing system, and the at least one other staging storage element comprises a second number of staging storage elements, each of the second number of staging storage element corresponding to a different pipeline stage of the pipelined data processing system, and wherein the second number is different than the first number.

8. The pipelined data processing system of claim 1, further comprising:
    a second MISR coupled to receive test data from a second plurality of test points located at predetermined nodes within the functional circuitry.

9. The pipelined data processing system of claim 1, wherein the MISR operates during a test mode, the pipelined data processing system further comprising:
    control circuitry coupled to the MISR to selectively enable the MISR during the test mode, the control circuitry comprising a register comprising a first field that is used to determine which test points of the plurality of test points are selected for testing, a second field that is used to enable the test mode and a third field that stores a saved value of the second field when exception processing begins.

10. The pipelined data processing system of claim 1, wherein the MISR result is independent of varying memory access times.

11. The pipelined data processing system of claim 1, wherein the MISR operates during a test mode, and wherein exceptions are continuously enabled during the test mode.

12. In a data processing system, a method comprising:
    during operation of the data processing system, entering a test mode;
    capturing test data and generating a deterministic signature in a multiple input shift register (MISR) during the test mode, while receiving and handling exceptions during the test mode;
    in response to acknowledging an interrupt request signal while in the test mode, using an enabling clock signal to keep the MISR enabled while capturing into the MISR a portion that is less than all of normal instruction execution results existing in a pipeline of the data processing system;
    flushing a remainder of the normal instruction execution results existing in the pipeline of the data processing system in response to acknowledging the interrupt request signal;
    disabling the MISR with the enabling clock signal;
    processing and completing execution of an exception associated with the interrupt request signal without capturing results from exception processing in the MISR;
    returning to instruction execution associated with the test mode with the MISR enabled by the enabling clock signal; and
    using the deterministic signature generated during the test mode to test functionality of circuitry within the data processing system.

13. The method of claim 12, further comprising providing control circuitry for detecting that normal instruction execution results exist in an execution stage of the pipeline and asserting the enabling clock to permit the MISR to capture normal instruction execution results in the execution stage.

14. The method of claim 12, wherein the capturing test data and generating the deterministic signature in the MISR during the test mode comprises:
providing functional circuitry having a plurality of test points located at predetermined circuit nodes within the functional circuitry;
providing at least one staging storing element associated with a pipeline stage of the data processing system, the at least one staging storage element coupled to receive test data directly from the plurality of test points; and
providing the MISR which receives test data from the at least one staging storage element and provides the deterministic signature.

15. The method of claim 14, further comprising:
in response to acknowledging an interrupt request signal while in the test mode, flushing contents of a decoder in the pipeline and nulling the decoder contents to a predetermined value.

16. In a pipelined data processing system, a method comprising:
providing functional circuitry having a plurality of test points located at predetermined circuit nodes within the functional circuitry;
providing at least one staging storage element associated with a pipeline stage of the pipelined data processing system, the at least one staging storage element receives test data directly from the plurality of test points when the system is in a test mode;
providing a multiple input shift register (MISR) which receives test data from the at least one staging storage element and provides a MISR result;
in response to acknowledging an interrupt request signal while in the test mode, using an enabling clock signal to keep the MISR enabled while capturing into the MISR a portion that is less than all of normal instruction execution results existing in a pipeline of the pipelined data processing system;
discarding a remainder of the normal instruction execution results existing in the pipeline of the data processing system in response to acknowledging the interrupt request signal; disabling the MISR with the enabling clock signal;
processing and completing execution of an exception associated with the interrupt request signal without capturing results from exception processing in the MISR; and
returning to instruction execution associated with the test mode with the MISR enabled by the enabling clock signal.

17. The method of claim 16, wherein the MISR result is independent of varying memory access times.

18. The method of claim 16, further comprising:
enabling the MISR when a corresponding instruction enters a write back pipeline stage of the pipelined data processing system.

19. The method of claim 16, further comprising:
providing at least one other staging storage element associated with a pipeline stage of the pipelined data processing system, the at least one other staging storage element receives test data from a second plurality of test points located at predetermined nodes within the functional circuitry;
providing a second MISR which receive test data from the at least one other staging storage element; and
enabling the second MISR when a corresponding instruction enters a write back pipeline stage of the pipelined data processing system.

20. The method of claim 19, wherein the at least one staging storage element comprises a first number of staging storage elements and the at least one other staging storage element comprises a second number of staging storage elements, the first number being different than the second number.

21. A method of testing a data processor comprising:
providing circuitry for placing the data processor in a test mode of operation;
providing circuitry for enabling and disabling a multiple input shift register (MISR) to capture data in the multiple input shift register to create a test value when the data processor is in the test mode of operation;
providing circuitry for selectively blocking enablement of the multiple input shift register (MISR) during at least a portion of exception processing performed by the data processor when the data processor was placed in the test mode of operation prior to exception processing;
in response to acknowledging an interrupt request signal while in the test mode of operation, using an enabling clock signal to keep the MISR enabled while capturing into the MISR a portion that is less than all of normal instruction execution results existing in a pipeline of the data processor;
discarding a remainder of the normal instruction execution results existing in the pipeline of the data processor in response to acknowledging the interrupt request signal;
disabling the MISR with the enabling clock signal;
processing and completing execution of an exception associated with the interrupt request signal without capturing results from exception processing in the MISR; and
returning to instruction execution associated with the test mode with the MISR enabled by the enabling clock signal.

22. The method of claim 21 further comprising:
providing control circuitry for generating the enabling clock and selectively disabling the multiple input shift register (MISR) during a pipeline stall of the data processor.

23. The method of claim 22 further comprising detecting that the pipeline stall is a result of a presence of a wait state in the pipeline resulting from variable memory access time.

* * * * *